United States Patent [19]

Nakai et al.

[11] Patent Number: 5,465,178

[45] Date of Patent: Nov. 7, 1995

[54] FOCUSING OPTICAL SYSTEM FOR SEMICONDUCTOR LASERS

[75] Inventors: Sadao Nakai, 6-45, Kita-Kasugaoka 3-Chome, Ibaraki-shi, Osaka 567; Masanobu Yamanaka, Minoo; Koji Ishikawa, Neyagawa; Tsuyoshi Sato, Tokyo; Kimiaki Yamamoto, Tokyo; Mikihiko Terashima, Tokyo, all of Japan

[73] Assignees: Olympus Optical Co., Ltd., Tokyo; Sadao Nakai, Osaka; Kimnon Electric Co. Ltd., Tokyo, all of Japan

[21] Appl. No.: 118,791

[22] Filed: Sep. 10, 1993

[30] Foreign Application Priority Data

Sep. 11, 1992 [JP] Japan .................. 4-243402

[51] Int. Cl.$^6$ .................. G02B 13/12; G02B 9/14; H01S 3/08
[52] U.S. Cl. .................. 359/670; 359/671; 359/710; 359/787; 359/788; 372/101
[58] Field of Search .................. 359/668, 670, 359/671, 710, 788, 785, 787; 372/101, 20

[56] References Cited

U.S. PATENT DOCUMENTS 4,203,652  5/1980  Hanada .................. 372/101
5,140,608  8/1992  Karpol et al. .................. 372/101

FOREIGN PATENT DOCUMENTS

61-254915  11/1986  Japan.
4-55016  5/1992  Japan.
4-153618  5/1992  Japan.

Primary Examiner—Georgia Y. Epps
Assistant Examiner—Evelyn A. Lester
Attorney, Agent, or Firm—Cushman, Darby & Cushman

[57] ABSTRACT

The invention is directed to a focusing optical system for semiconductor lasers, which is regulated in terms of magnification power in both its directions normal to the optical axis, so that the back focus of sufficient magnitude can be made equal in both the directions and the magnitude of aberration can be regulated to achieve an improvement in focusing efficiency, and in which a light beam from a semiconductor laser having varying exit angles in the horizontal and vertical directions is focused on a spot having substantially equal diameters in the horizontal and vertical directions. This focusing optical system comprises first lens unit L1 including a rotation asymmetric lens having positive power in the direction defined by a large exit angle at which a laser beam emanates from the laser, a second lens unit L2 including at least one lens of negative power, and a third lens unit L3 that is a rotation asymmetric lens unit having positive power in the directions defined by both large and small exit angles.

7 Claims, 11 Drawing Sheets

−10. 10.
Spherical aberration

−2.0 2.0
Astigmatism

−5.0 5.0
Spherical aberration

−10. 10.
Astigmatism

FIG. 10(a)

Spherical aberration

FIG. 10(b)

Astigmatism

FIG. 10(c)

Spherical aberration

FIG. 10(d)

Astigmatism

−5.0  5.0
Spherical aberration

−0.5  0.5
Astigmatism

−10.  10.
Spherical aberration

−10.  10.
Astigmatism

FOCUSING OPTICAL SYSTEM FOR SEMICONDUCTOR LASERS

BACKGROUND OF THE INVENTION

The present invention relates to a focusing optical system for semiconductor lasers and, more particularly, to a focusing optical system for a semiconductor laser, which enables a light beam emitted from the semiconductor laser to be focused with so high efficiency that energy can be well obtained.

A semiconductor laser, because of being small, inexpensive and suitable for mass-production, has been used as a light source for laser printers and optical disk pickups, and has been utilized as an energy source of high power as well. However, a light source built up of a high-power semiconductor laser obtained by the integration of a number of minuscule light sources is in linear configuration, with the divergent angle in the direction vertical to the longitudinal direction being much larger than that in the longitudinal direction, so that no efficient focusing can be achieved with the use of a rotation symmetric optical system. In order to achieve efficient focusing, therefore, it is known that a rotation asymmetric optical system is used to focus a light beam on a spot with the longitudinal diameter substantially equal to the vertical diameter. An optical system having such action is known from JP-A-61-254915, but it says nothing about what problems arise practically in connection with aberration correction, back focus length, etc. Some other rotation asymmetric optical systems are disclosed in JP-A-4-55016 and JP-A-4-153618.

Light emitted from a linear laser emission portion is much larger in terms of the divergent angle in the direction vertical to the longitudinal direction rather than in the longitudinal direction. In this regard, JP-A-4-55016 teaches the use of a simple combination of two cylindrical lenses, whereby the laser beam diameters in the vertical and horizontal directions are made equal to each other. This means that the allocation of power to the longitudinal and vertical directions is calculated at such magnification power that provides a demagnifying system in the longitudinal direction and a magnifying system in the direction vertical thereto. At a high numerical aperture, however, this alone offers some practical problems, because any efficient focusing is not achievable due to a divergent off-axial light beam. JP-A-4-153618 discloses a lens system designed with the focusing efficiency in mind. However, no care is taken of the magnification of the enlarging system, because the line width of the linear light source is infinitely small. Nor is any care taken of back focus length; in other words, the mounting of peripheral devices offers some problems at a short back focus length.

Recently, there is also an available stratified light source with the line width being not taken as infinitesimal, in which case the magnification power in the vertical direction must be regulated. With this, focusing must also be done with suitable aberrations so as not to allow the image vertical to the longitudinal direction to be in a stratified form.

SUMMARY OF THE INVENTION

In view of such situations, an object of the invention is to provide a focusing optical system for semiconductor lasers, which is regulated in terms of magnification power in both its directions normal to the optical axis so that the back focus can be made equal in both the directions and be large enough and is adjusted in terms of aberration magnitude so that focusing efficiency can be much more improved.

According to the invention, the object mentioned above is achieved by the provision of a focusing optical system for semiconductor lasers, in which a light beam emitted from a light source having varying exit angles in the horizontal and vertical directions is focused on a spot form having substantially equal diameters in said horizontal and vertical directions, said focusing optical system comprising a first lens unit including at least one rotation asymmetric lens having positive power with respect to the direction defined by the larger exit angle of said varying exit angles, a second lens unit including at least a negative power lens, and a third lens unit including at least one rotation asymmetric lens and having as a whole positive power with respect to the direction defined by said larger exit angle and having as a whole positive power with respect to the direction defined by the smaller exit angle.

According to the invention, it is desired that the positive power of the third lens unit with respect to the direction defined by the larger exit angle be different from that with respect to the direction defined by the smaller exit angle. In this case, the positive power of the third lens unit with respect to the direction defined by the smaller exit angle is approximately stronger than that with respect to the direction defined by the larger exit angle.

The second lens unit may be designed to have a lens of negative power and a lens of positive power. Alternatively, the negative power lens forming the second lens unit may be designed to be rotation symmetric in configuration. Yet alternatively, the second lens unit may at least have, in order from the incident side of a laser beam, a positive power lens and a negative power lens or a negative power lens and a positive power lens.

According to the invention, it is desired that the following condition be satisfied:

$$|\Psi_{2y} f_y| < 0.5$$

where $\Psi_{2y}$ is the composite power of the second lens unit in the direction defined by the larger exit angle, and $f_y$ is the focal length of the overall system in the direction defined by the larger exit angle.

In the ensuing description, why the above-mentioned arrangement is used and how it acts will be specifically explained.

Figures 1A, 1B:
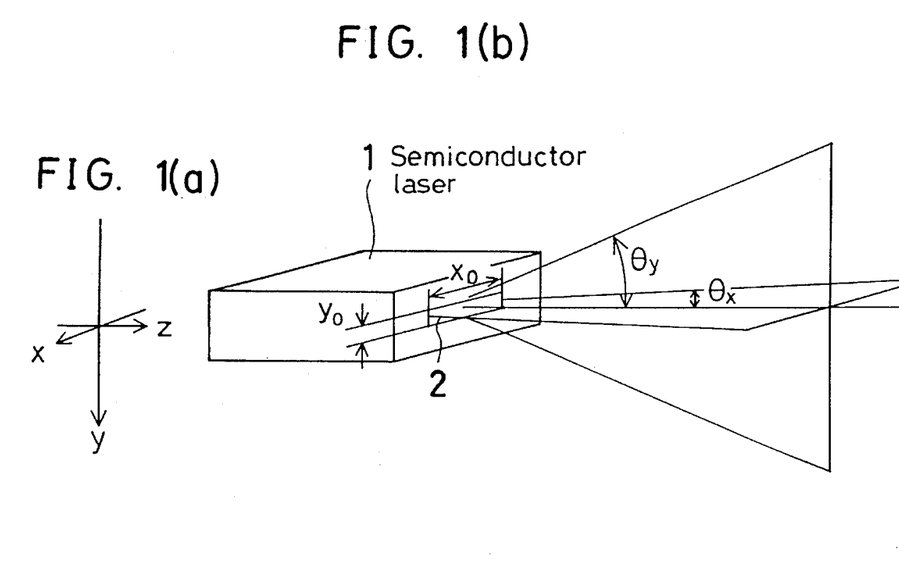
FIGS. 1(a) and 1(b) are a coordinate system and is a perspective schematic of a light beam emitted from a semiconductor laser and a light source.

FIG. 1 is a perspective view of what states a light beam emitted from a semiconductor laser 1 and a light source 2 are in. One exit angle $\theta_x$ of the light source 2 in its longitudinal direction (shown by x) is much smaller than another exit angle $\theta_y$ in the direction (shown by y) vertical thereto ($\theta_x < \theta_y$). Now let $x_0$ and $y_0$ represent the sizes of the light source 2 in the longitudinal and vertical directions, respectively. Then, the configuration of the light source 2 is then defined by $x_0 > y_0$. Let us consider the case where the light beam is focused on a spot defined by the following condition:

$x < x_0$, $y > y_0$, and $x \approx y$     Condition (1)

Thus, the x direction defines a demagnifying system with the demagnification power $b_x$ represented by $|b_x| < 1$, and the y direction defines a magnifying system with the magnification power $b_y$ represented by $|b_y| > 1$. It is noted, however, that the magnification power $b_y$ of the magnifying system according to the invention is about a few times $b_x$, because the invention is designed to be applicable to a linear light source where $Y_0 \neq 0$.

Figure 2A:
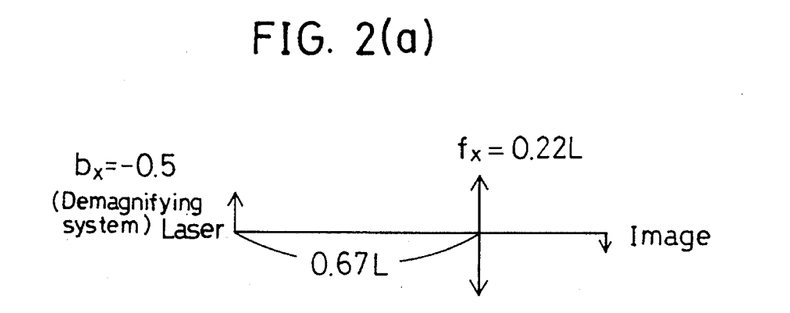
FIGS. 2(a) and 2(b) are one example of the magnitude and allocation of power whereby each of the demagnifying and magnifying systems is achieved with one positive lens.
Figure 2B:
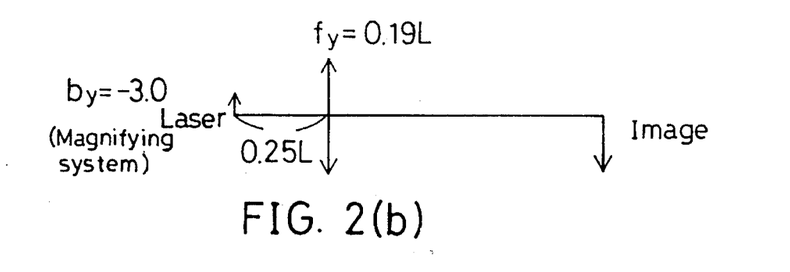

First, let us consider the case where the demagnifying and magnifying systems are each made up of one positive lens, while the distance between the light source and the image surface is kept constant. FIG. 2 represents the lens location and power determined by calculation. Here, the magnification power is assumed to be −0.5 for $b_x$ and −3.0 for $b_y$. In FIG. 2, L is the distance between the light source and the image surface, $f_x$ is the focal length of the positive lens in the x direction, and $f_y$ is the focal length of the positive lens in the y direction.

As can be seen from FIG. 2, it is required that the demagnifying system have its power on the image side and the magnifying system have its power on the laser side. However, considerably strong positive power must be allocated in the vicinity of the laser. This is because the light beam in the y direction has a high numeral aperture (NA), and so the light beam becomes too divergent, resulting in a focusing efficiency drop, unless the divergent angle is made small enough at a position as close to the laser as possible. If this is done, however, the positive power then becomes too close to the laser side, thus making the magnification power considerably larger than required. To avoid this or limit the magnification power to about five to seven, it is required that weak positive power be allocated to the image side to move the power toward the image side. For the demagnifying system, on the other hand, suitable positive power may be relatively allocated to the image side, thus enabling the magnification power to assume on a suitable value.

In consideration of the image-formation magnification power alone, it is preferable that the magnifying system has strong positive power on the laser side and weak positive power on the image side, while the demagnifying system has suitable positive power on the image side, conforming to the magnification power. In this power allocation, however, the magnifying system, because of being of too strong composite power, is considerably reduced in terms of back focus length. Also, the demagnifying system, if constructed from a positive lens unit alone, fails to ensure any back focus, and has a large Petzval's sum as well, resulting in an increase in the quantity of light leaking from the spot and, hence, a focusing efficiency drop.

To solve this, it is preferable that the demagnifying and magnifying systems are each of the so-called retrofocus type where negative power is allocated to the laser side rather than positive power is allocated to the image side, whereby, once the height of the ray with respect to the optical axis has been elevated, the light beam is focused on the spot with positive power. More illustratively, it is preferred that the magnifying system is constructed from, in order from the laser side, a lens unit having positive power, a lens unit including a negative lens and a lens unit having positive power, and the demagnifying system is constructed from, in order from the laser side, a lens unit including a negative lens and a lens unit having positive power. According to this unit arrangement, the negative lenses allow the magnifying and demagnifying systems to be each of the retrofocus type, so that the back focus can be ensured, and the Petzval's sum can be so reduced that the light beam can be focused on the spot with high efficiency.

In order to achieve such power allocation with one optical system, it is preferable that the overall lens system is constructed from the following three lens units. In other words, since the power in the x direction may not be so strong as that in the y direction on the laser side, it is preferable that the first lens unit is a rotation asymmetric lens unit having positive power in the y direction, the second lens unit is a lens unit having negative power, and the third lens unit is a rotation asymmetric lens unit having positive power in both the x and y directions, with the power in the x direction being stronger than that in the y direction.

It is also preferable that the second lens unit is used in combination with a lens having positive power, because when its negative power is too strong, the light beam becomes excessively divergent.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

In the following description, the focusing optical system according to the invention will be explained, more illustratively but not exclusively, with reference to some embodiments.

Figure 3A:
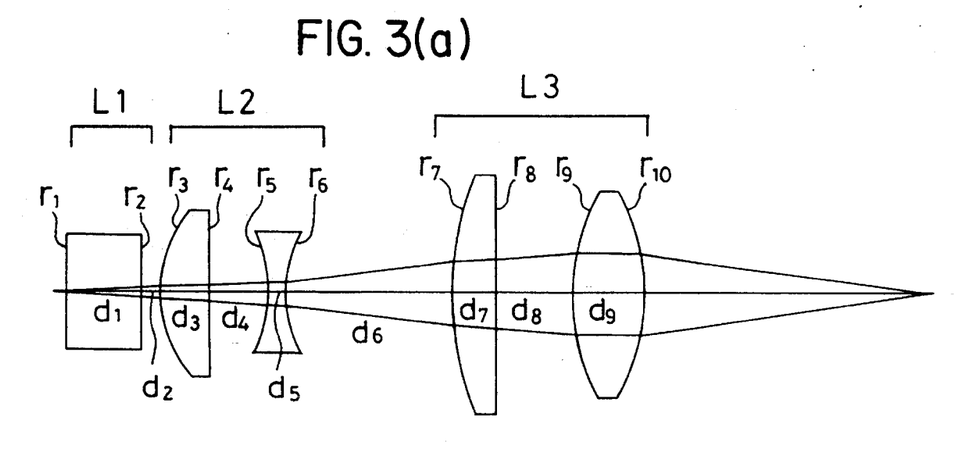
FIGS. 3(a) and 3(b) represent sections of one embodiment of the focusing optical system according to the invention, with FIG. 3(a) and FIG. 3(b) being the sectional views in the x and y directions, respectively.
Figure 3B:
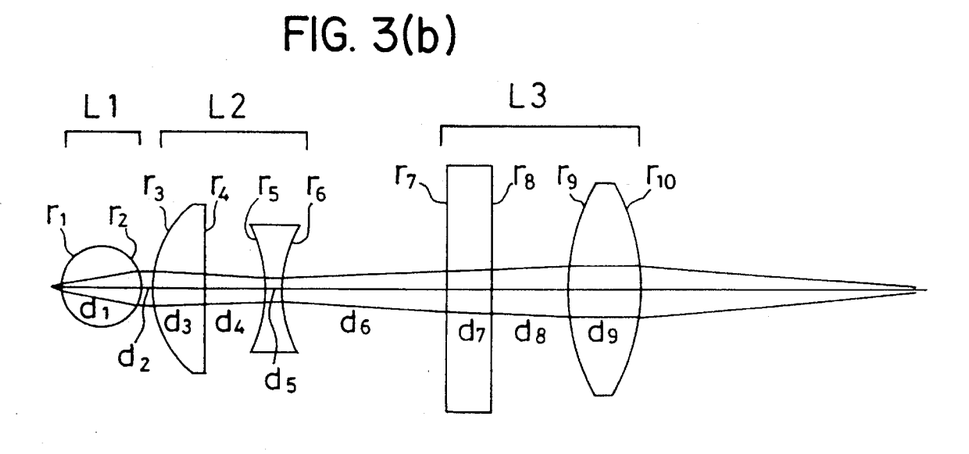

FIG. 3 represents sections of the first embodiment of the focusing optical system according to the invention, with (a) and (b) being sectional views thereof in the x and y directions, respectively. The first embodiment of the invention comprises, in order from the laser side, a first lens unit L1 consisting of a cylindrical lens having strong positive power in the y direction, a second lens unit L2 consisting of a positive single lens and a negative single lens arranged in the positive - negative order, and a third lens unit L3 consisting of a cylindrical lens having positive power in the x direction and a single lens having positive power. In the y direction, the strong positive power of the first lens unit L1 lowers the height of the off-axial principal ray and makes the width of the off-axial light beam narrow. After the height of the off-axial principal ray is elevated through a combination of the positive and negative lenses forming the second lens unit L2 to such an extent that the width of the off-axial light beam is not excessively widened, the light beam is focused on the spot through the third lens unit L3. In the x direction, the first lens unit L1 has no power, and the height of the off-axial principal ray is elevated through a combination of the positive and negative lenses forming the second lens unit L2, so that the positive power can be made larger in the x direction than in the y direction through a combination of the cylindrical lens having positive power in the x direction with the single lens of positive power, both forming the third lens unit L3. Referring here to the second lens unit L2, it may consist of any number of lens elements in any desired order. Especially with the negative power being too strong in the y direction, however, there is some considerable increase in the width of the off-axial light beam, making the outer diameter of the lens on the image side too large to ensure any back focus and making Petzval's sum large. With the positive power being too strong, on the contrary, it is impossible to ensure any back focus, resulting in an increase in Petzval's sum. Consequently, the composite power should preferably be reduced. More specifically, the following condition (2) should preferably be satisfied:

$|\Psi_{2y} f_y| < 0.5$ where $\Psi_{2y}$ is the composite power of the second lens unit in the y direction, and $f_y$ is the focal length of the overall lens system in the y direction. It is also preferable to use lenses of power that is enough for suitable aberration, thereby preventing the image in the y direction from stratifying.

Figure 4A:
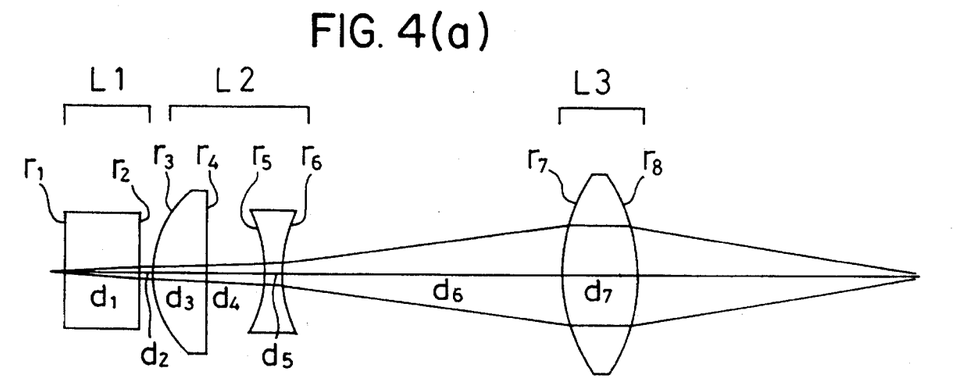
FIGS. 4(a) and 4(b) are sectional views, similar to those of FIGS. 3(a) and 3(b), of another embodiment of the focusing optical system according to the invention.
Figure 4B:
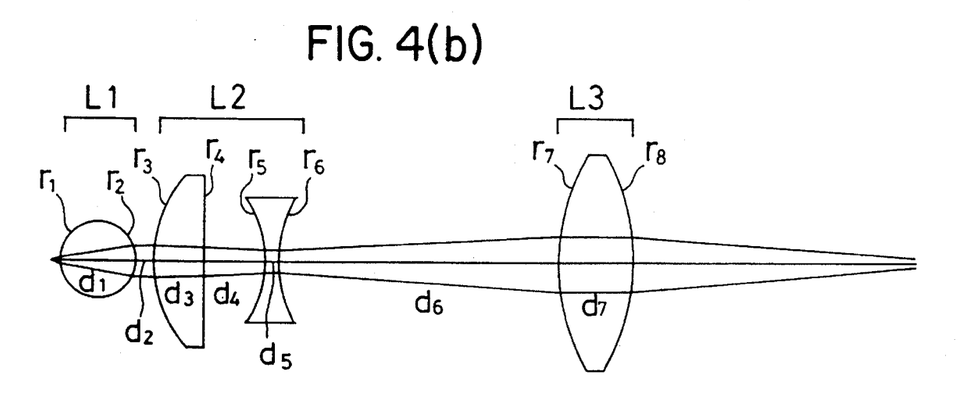

Sections of the second embodiment of the focusing optical system according to the invention are illustrated in FIG. 4 that is similar to FIG. 3. As illustrated, the third lens unit L3 of this embodiment consists of one toroidal lens rather than the combination of a cylindrical lens with a single lens as used in the first embodiment. This enables the number of the lenses used to be reduced.

Figure 5A:
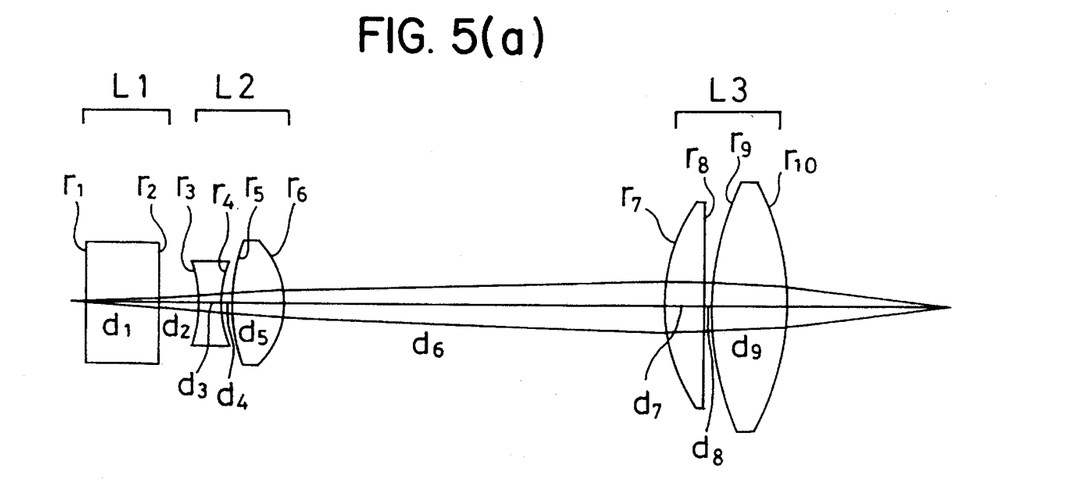
FIGS. 5(a) and 5(b) are sectional views, similar to those of FIGS. 3(a) and 3(b), of the third embodiment of the focusing optical system according to the invention.
Figure 5B:
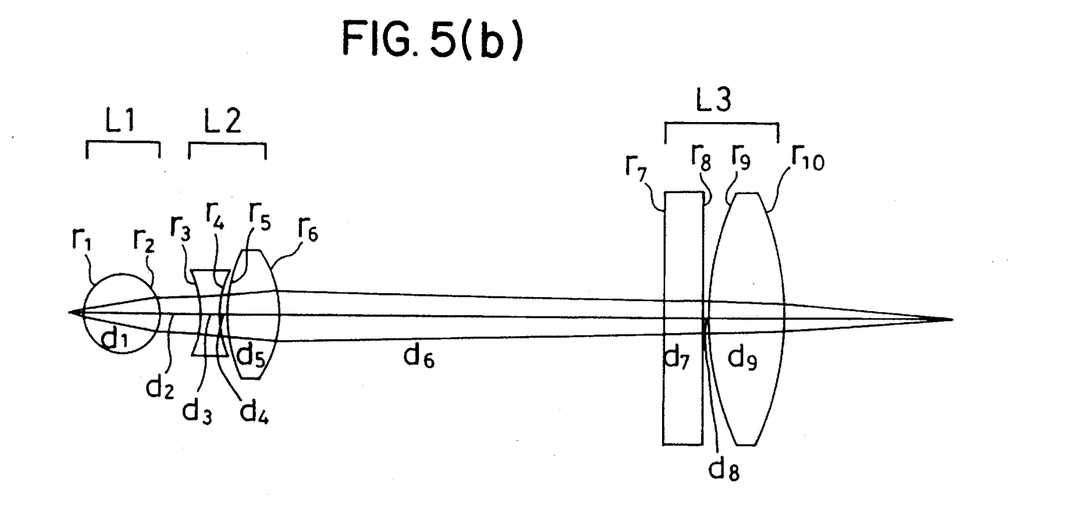

Sections of the third embodiment of the focusing optical system according to the invention are shown in FIG. 5 that is similar to FIG. 3. The second lens unit L2 of this embodiment consists of a negative and positive lens combination rather than the positive and negative lens combination as used in the first embodiment mentioned above, resulting in an aberration reduction in the y direction. This is because the positive lens of the second lens unit L2 is located closer to the image side in the third embodiment than in the first embodiment, so that the positive power can be moved toward the image side, thereby attenuating the positive power in the y direction with the third lens unit L3 having the maximum ray height.

Figure 6A:
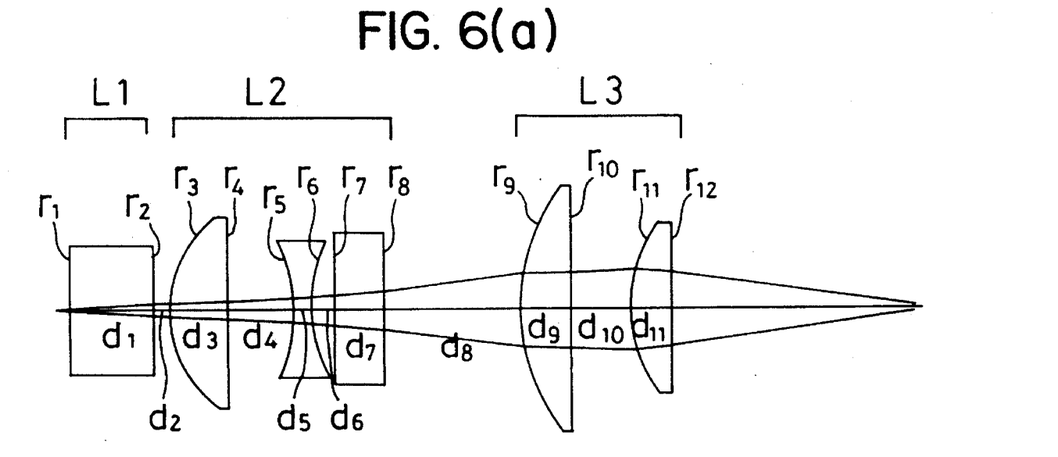
FIGS. 6(a) and 6(b) are sectional views, similar to those of FIGS. 3(a) and 3(b), of the fourth embodiment of the focusing optical system according to the invention.
Figure 6B:
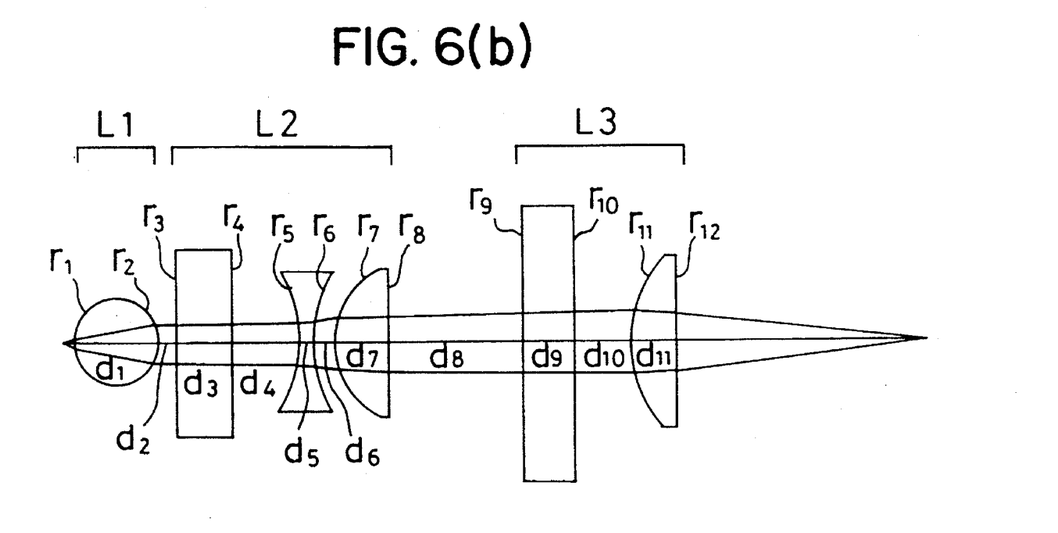

Sections of the fourth embodiment of the focusing optical system according to the invention are illustrated in FIG. 6 that is similar to FIG. 3. As illustrated, the second lens unit L2 of this embodiment consists of two positive power cylindrical lenses and one negative single lens rather than the combination of positive and negative single lenses as used in the first embodiment, so that the order of power is positive and negative in the x direction, and is negative and positive in the y direction. Consequently, the height of the ray can be lowered in the y direction, resulting in an aberration reduction. In addition, even when the object is of considerable height, the width of the off-axial principal ray can be prevented from becoming too wide, thus having satisfactory focusing action.

Figure 7A:
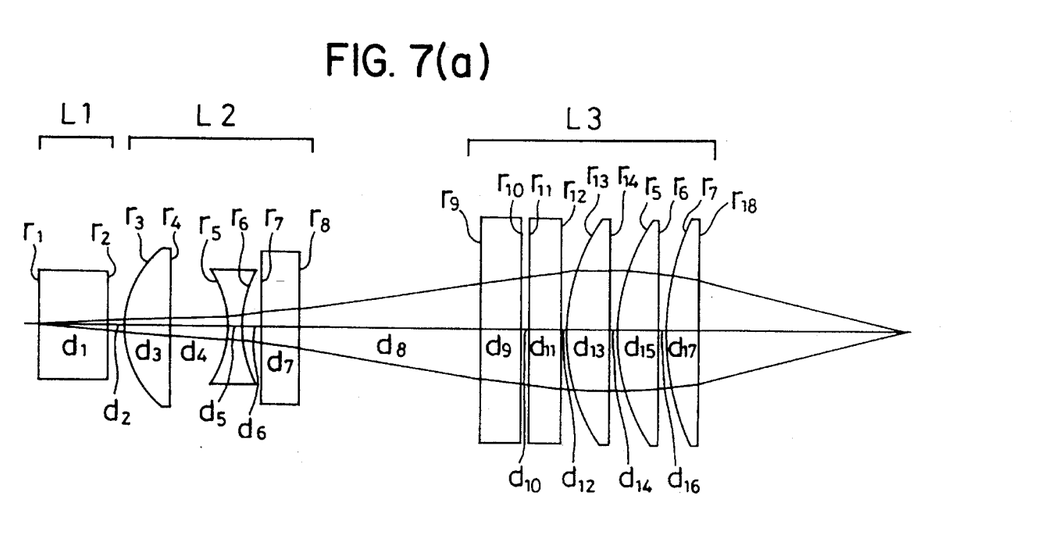
FIGS. 7(a) and 7(b) are sectional views, similar to those of FIGS. 3(a) and 3(b), of the fifth embodiment of the focusing optical system according to the invention.
Figure 7B:
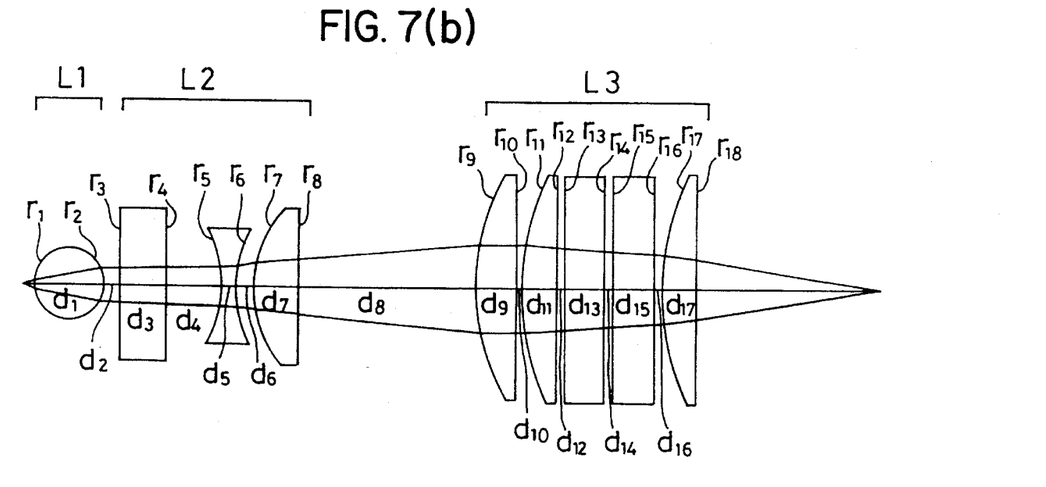
Figure 8A:
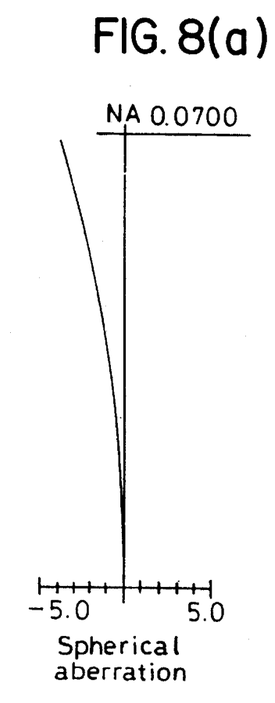
FIGS. 8(a) through 8(d) are aberration diagrams showing the spherical aberration and astigmatism of the first embodiment, with FIGS. 8(a) and 8(b) and FIGS. 8(c) and 8(d) being the aberration diagrams across the sections in the x and y directions, respectively.
Figure 8B:
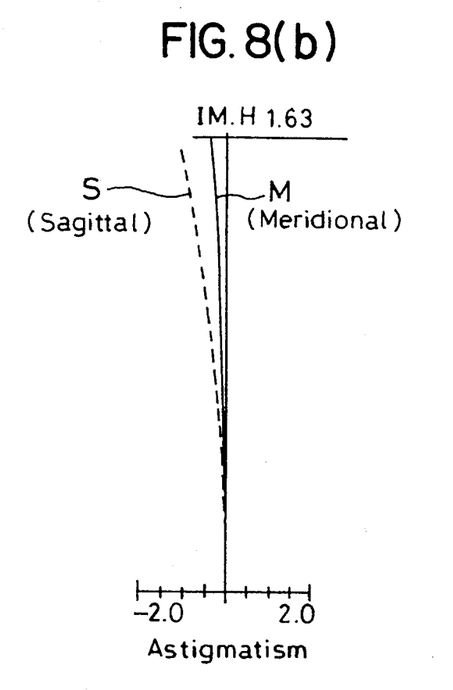
Figure 8C:
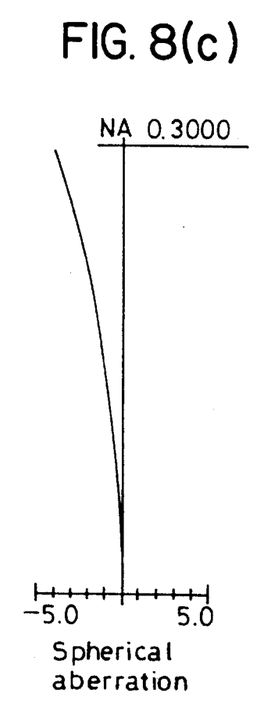
Figure 8D:
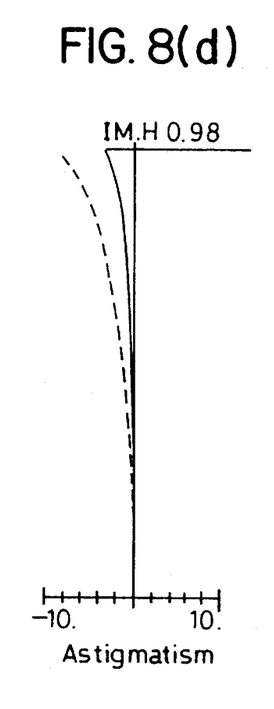
Figure 9A:
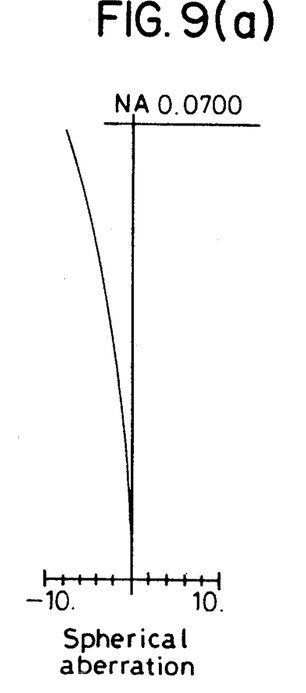
FIGS. 9(a) through 9(d) are aberration diagrams, similar to those of FIGS. 8(a) through 8(c) of the second embodiment.
Figure 9B:
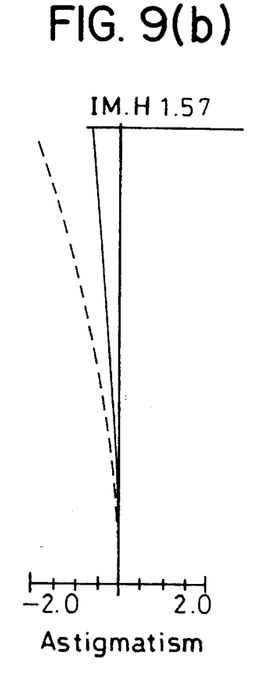
Figure 9C:
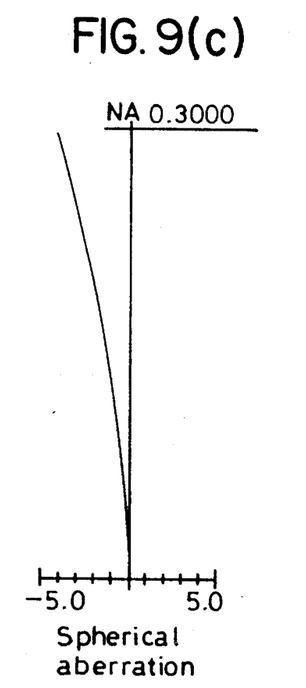
Figure 9D:
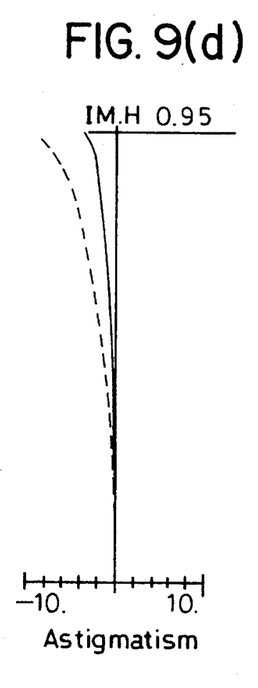
Figure 10A:
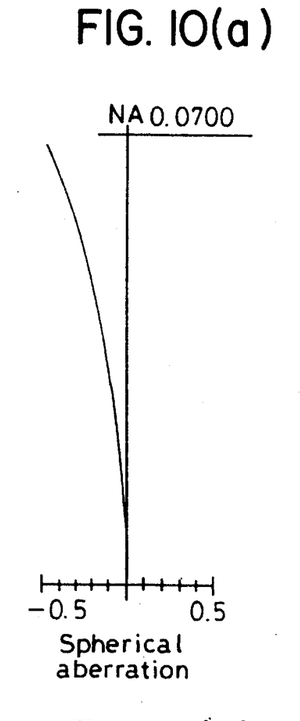
FIGS. 10(a) through 10(d) are aberration diagrams, similar to those of FIGS. 8(a) through 8(d) of the third embodiment.
Figure 10B:
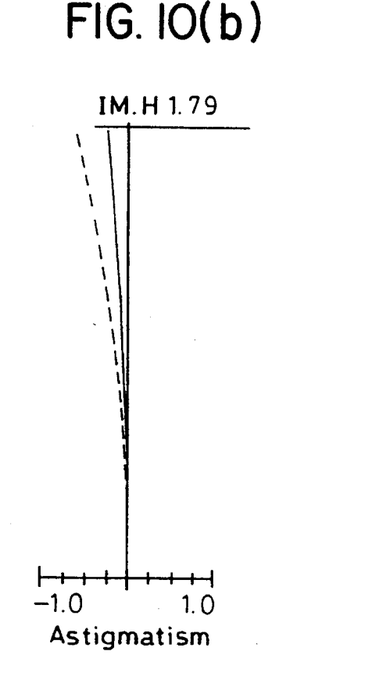
Figure 10C:
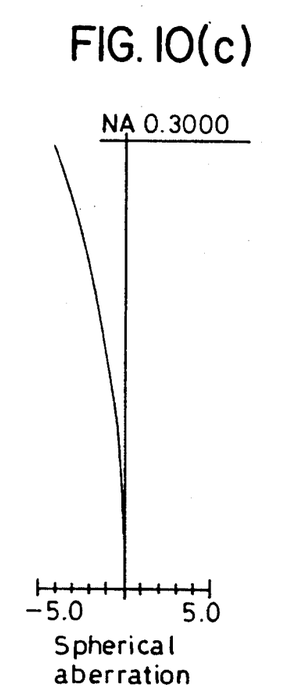
Figure 10D:
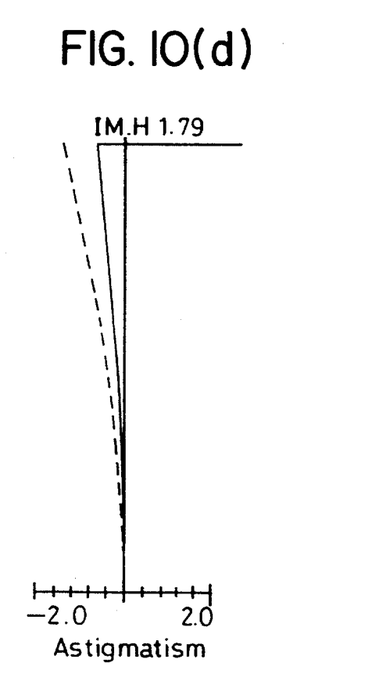
Figure 11A:
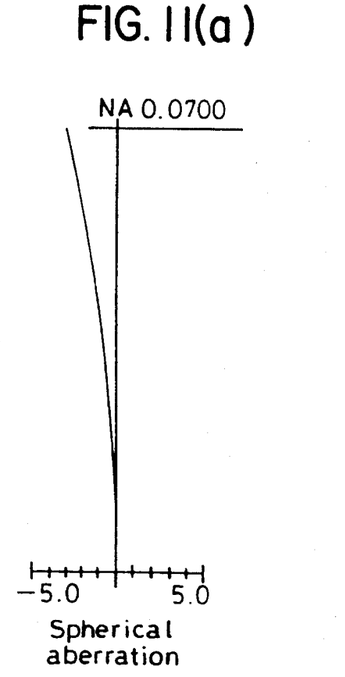
FIGS. 11(a) through 11(d) are aberration diagrams, similar to those of FIGS. 8(a) through 8(d) of the fourth embodiment.
Figure 11B:
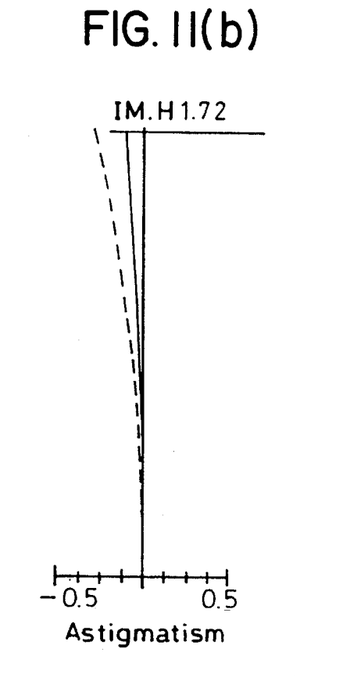
Figure 11C:
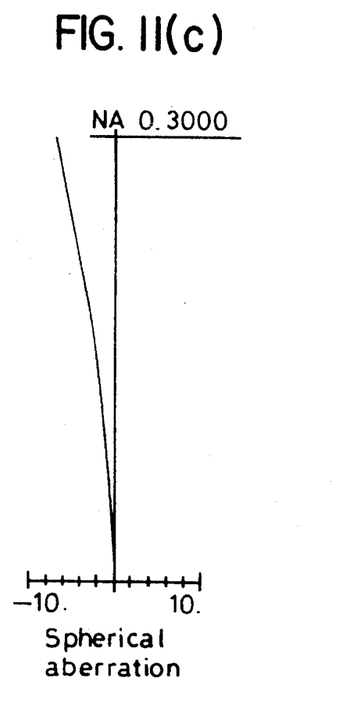
Figure 11D:
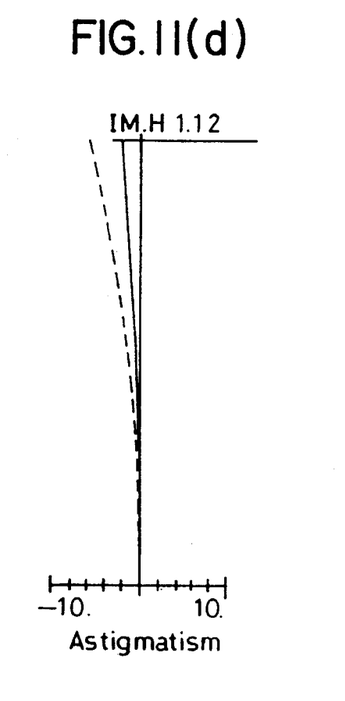
Figure 12A:
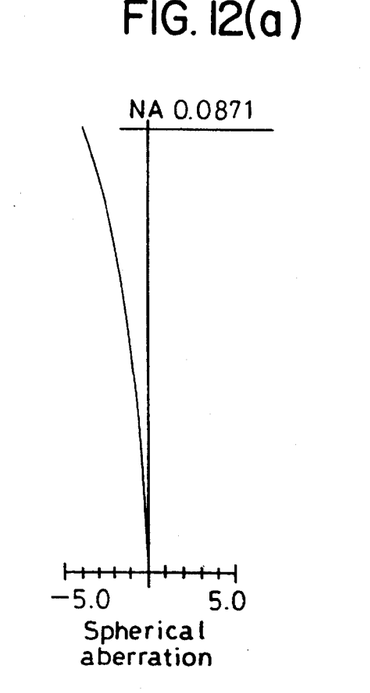
FIGS. 12(a) through 12(d) are aberration diagrams, similar to those of FIGS. 8(a) through 8(d) of the fifth embodiment.
Figure 12B:
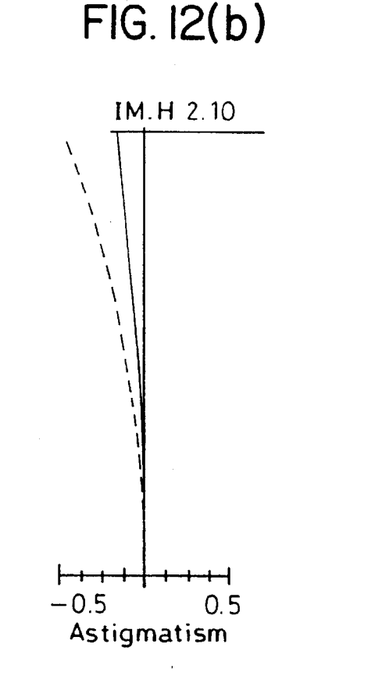
Figure 12C:
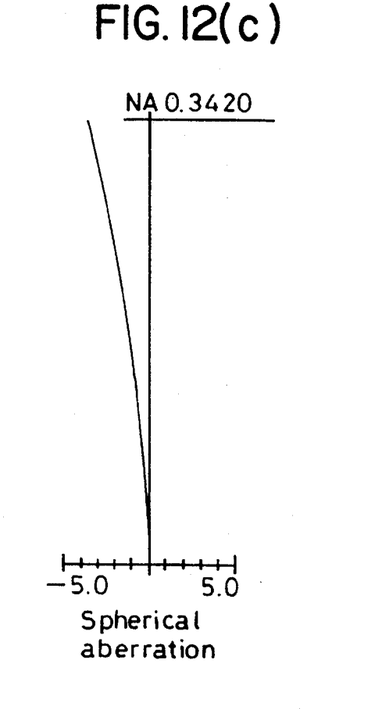
Figure 12D:
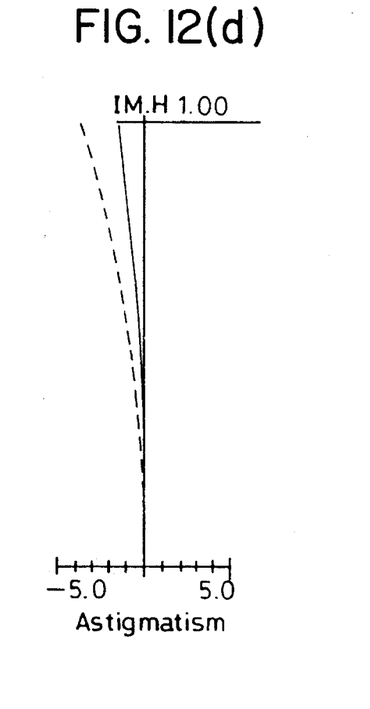

Sections of the fifth embodiment of the focusing optical system according to the invention are illustrated in FIG. 7 that is similar to FIG. 3. As illustrated, the third lens unit L3 of this embodiment consists of a combination of four cylindrical lenses with one positive power lens rather than the combination of a positive power single lens with a positive power cylindrical lens as used in the fourth embodiment. This enables the ray to be gradually flexed through the third lens unit L3 having the maximum ray height, so that satisfactory aberration removal is achieved. In addition, even when the object is of considerable height, the light beam can be focused at a suitable magnification power on a spot having substantially equal diameters in both the x and y directions.

Enumerated below are the lens data of the first to fifth embodiments mentioned above. It is noted that symbols mentioned below but not referred to hereinbefore means:

$r_1, r_2 \ldots$ the radii of curvature of the lens surfaces,
$d_1, d_2 \ldots$ the separations between the lens surfaces,
$n_{1,810}, n_{2,810} \ldots$ the refractive indices of the lenses at the wavelength of 810 nm,
$f_x, f_y \ldots$ the focal lengths of the overall lens system in the x and y directions, respectively,
$NA_x, NA_y \ldots$ the numerical apertures in the x and y directions, respectively, and
$s_1 \ldots$ the object distance from the first surface.

Example 1

<x-direction>

$f_x = 41.786$
$NA_x = 0.070$
$b_x = -0.536$
$s_1 = -1.50$
$x_0 = 6.00$

| | | |
|---|---|---|
| $r_1 = \infty$ | $d_1 = 10.00$ | $n_{1,810} = 1.51012$ |
| $r_2 = \infty$ | $d_2 = 2.00$ | |
| $r_3 = 15.00$ | $d_3 = 7.00$ | $n_{2,810} = 1.51012$ |
| $r_4 = \infty$ | $d_4 = 8.00$ | |
| $r_5 = -15.57$ | $d_5 = 2.00$ | $n_{3,810} = 1.51012$ |
| $r_6 = 15.74$ | $d_6 = 22.00$ | |
| $r_7 = 42.00$ | $d_7 = 6.00$ | $n_{4,810} = 1.51012$ |
| $r_8 = \infty$ | $d_8 = 10.00$ | |
| $r_9 = 26.00$ | $d_9 = 10.00$ | $n_{5,810} = 1.51012$ |
| $r_{10} = -26.00$ | | |

<y-direction>

$f_y = -5.397$
$NA_y = 0.300$
$b_y = -3.08084$
$s_1 = -1.50$
$y_0 = 1.00$
$|\Psi_{2y} f_y| = 0.0135$

| | | |
|---|---|---|
| $r_1 = 5.00$ | $d_1 = 10.00$ | $n_{1,810} = 1.51012$ |
| $r_2 = -5.00$ | $d_2 = 2.00$ | |
| $r_3 = 15.00$ | $d_3 = 7.00$ | $n_{2,810} = 1.51012$ |
| $r_4 = \infty$ | $d_4 = 8.00$ | |
| $r_5 = -15.57$ | $d_5 = 2.00$ | $n_{3,810} = 1.51012$ |

-continued

| | | |
|---|---|---|
| $r_6 = 15.74$ | $d_6 = 22.00$ | |
| $r_7 = \infty$ | $d_7 = 6.00$ | |
| $r_8 = \infty$ | $d_8 = 10.00$ | |
| $r_9 = 26.00$ | $d_9 = 10.00$ | $n_{5,810} = 1.51012$ |
| $r_{10} = -26.00$ | | |

Example 2

<x-direction>

$f_x = 43.615$
$NA_x = 0.070$
$b_x = -0.51447$
$s_1 = -1.50$
$x_0 = 6.00$

| | | |
|---|---|---|
| $r_1 = \infty$ | $d_1 = 10.00$ | $n_{1,810} = 1.51012$ |
| $r_2 = \infty$ | $d_2 = 2.00$ | |
| $r_3 = 15.00$ | $d_3 = 7.00$ | $n_{2,810} = 1.51012$ |
| $r_4 = \infty$ | $d_4 = 8.00$ | |
| $r_5 = -15.57$ | $d_5 = 2.00$ | $n_{3,810} = 1.51012$ |
| $r_6 = 15.74$ | $d_6 = 38.00$ | |
| $r_7 = 23.00$ | $d_7 = 10.00$ | $n_{4,810} = 1.51012$ |
| $r_8 = -26.00$ | | |

<y-direction>

$f_y = -5.261$
$NA_y = 0.300$
$b_y = -3.08217$
$s_1 = -1.50$
$y_0 = 1.00$
$|\Psi_{2y} f_y| = 0.0132$

| | | |
|---|---|---|
| $r_1 = 5.00$ | $d_1 = 10.00$ | $n_{1,810} = 1.51012$ |
| $r_2 = -5.00$ | $d_2 = 2.00$ | |
| $r_3 = 15.00$ | $d_3 = 7.00$ | $n_{2,810} = 1.51012$ |
| $r_4 = \infty$ | $d_4 = 8.00$ | |
| $r_5 = -15.57$ | $d_5 = 2.00$ | $n_{3,810} = 1.51012$ |
| $r_6 = 15.74$ | $d_6 = 38.00$ | |
| $r_7 = 28.00$ | $d_7 = 10.00$ | $n_{4,810} = 1.51012$ |
| $r_8 = -26.00$ | | |

Example 3

<x-direction>

$f_x = 29.248$
$NA_x = 0.070$
$b_x = -0.57806$
$s_1 = -1.50$
$x_0 = 6.00$

| | | |
|---|---|---|
| $r_1 = \infty$ | $d_1 = 10.00$ | $n_{1,810} = 1.51012$ |
| $r_2 = \infty$ | $d_2 = 5.20$ | |
| $r_3 = -15.57$ | $d_3 = 3.00$ | $n_{2,810} = 1.51012$ |
| $r_4 = 15.57$ | $d_4 = 0.80$ | |
| $r_5 = 20.00$ | $d_5 = 7.00$ | $n_{3,810} = 1.51012$ |
| $r_6 = -12.00$ | $d_6 = 50.00$ | |
| $r_7 = 25.00$ | $d_7 = 5.00$ | $n_{4,810} = 1.51012$ |
| $r_8 = \infty$ | $d_8 = 1.00$ | |
| $r_9 = 35.00$ | $d_9 = 10.00$ | $n_{5,810} = 1.51012$ |
| $r_{10} = -35.00$ | | |

<y-direction>

$f_y = -4.496$
$NA_y = 0.300$
$b_y = -3.58970$
$s_1 = -1.50$
$y_0 = 1.00$
$|\Psi_{2y} f_y| = 0.1739$

| | | |
|---|---|---|
| $r_1 = 5.00$ | $d_1 = 10.00$ | $n_{1,810} = 1.51012$ |
| $r_2 = -5.00$ | $d_2 = 5.20$ | |
| $r_3 = -15.57$ | $d_3 = 3.00$ | $n_{2,810} = 1.51012$ |
| $r_4 = 15.57$ | $d_4 = 0.80$ | |
| $r_5 = 20.00$ | $d_5 = 7.00$ | $n_{3,810} = 1.51012$ |
| $r_6 = -12.00$ | $d_6 = 50.00$ | |
| $r_7 = \infty$ | $d_7 = 5.00$ | $n_{4,810} = 1.51012$ |
| $r_8 = \infty$ | $d_8 = 1.00$ | |
| $r_9 = 35.00$ | $d_9 = 10.00$ | $n_{5,810} = 1.51012$ |
| $r_{10} = -35.00$ | | |

Example 4

-continued

<x-direction>

$f_x = 51.644$
$NA_x = 0.070$
$b_x = -0.57437$
$s_1 = -1.50$
$x_0 = 6.00$

| | | |
|---|---|---|
| $r_1 = \infty$ | $d_1 = 10.00$ | $n_{1,810} = 1.51012$ |
| $r_2 = \infty$ | $d_2 = 2.00$ | |
| $r_3 = 12.975$ | $d_3 = 7.00$ | $n_{2,810} = 1.51012$ |
| $r_4 = \infty$ | $d_4 = 8.00$ | |
| $r_5 = -15.57$ | $d_5 = 2.00$ | $n_{3,810} = 1.51012$ |
| $r_6 = 15.57$ | $d_6 = 2.50$ | |
| $r_7 = \infty$ | $d_7 = 6.00$ | $n_{4,810} = 1.51012$ |
| $r_8 = \infty$ | $d_8 = 16.00$ | |
| $r_9 = 23.00$ | $d_9 = 6.00$ | $n_{5,810} = 1.51012$ |
| $r_{10} = \infty$ | $d_{10} = 7.00$ | |
| $r_{11} = 15.00$ | $d_{11} = 5.00$ | $n_{6,810} = 1.51012$ |
| $r_{12} = \infty$ | | |

<y-direction>

$f_y = -10.804$
$NA_y = 0.300$
$b_y = -2.56330$
$s_1 = -1.50$
$y_0 = 1.00$
$|\Psi_{2y} f_y| = 0.0560$

| | | |
|---|---|---|
| $r_1 = 5.00$ | $d_1 = 10.00$ | $n_{1,810} = 1.51012$ |
| $r_2 = -5.00$ | $d_2 = 2.00$ | |
| $r_3 = \infty$ | $d_3 = 7.00$ | $n_{2,810} = 1.51012$ |
| $r_4 = \infty$ | $d_4 = 8.00$ | |
| $r_5 = -15.57$ | $d_5 = 2.00$ | $n_{3,810} = 1.51012$ |
| $r_6 = 15.57$ | $d_6 = 2.50$ | |
| $r_7 = 10.00$ | $d_7 = 6.00$ | $n_{4,810} = 1.51012$ |
| $r_8 = \infty$ | $d_8 = 16.00$ | |
| $r_9 = \infty$ | $d_9 = 6.00$ | $n_{5,810} = 1.51012$ |
| $r_{10} = \infty$ | $d_{10} = 7.00$ | |
| $r_{11} = 15.00$ | $d_{11} = 5.00$ | $n_{6,810} = 1.51012$ |
| $r_{12} = \infty$ | | |

Example 5

<x-direction>

$f_x = 78.856$
$NA_x = 0.08715$
$b_x = -0.41245$
$s_1 = -1.50$
$x_0 = 10.00$

| | | |
|---|---|---|
| $r_1 = \infty$ | $d_1 = 10.00$ | $n_{1,810} = 1.51012$ |
| $r_2 = \infty$ | $d_2 = 2.00$ | |
| $r_3 = 12.975$ | $d_3 = 7.00$ | $n_{2,810} = 1.51012$ |
| $r_4 = \infty$ | $d_4 = 8.00$ | |
| $r_5 = -15.57$ | $d_5 = 2.00$ | $n_{3,810} = 1.51012$ |
| $r_6 = 15.57$ | $d_6 = 2.50$ | |
| $r_7 = \infty$ | $d_7 = 6.00$ | $n_{4,810} = 1.51012$ |
| $r_8 = \infty$ | $d_8 = 26.00$ | |
| $r_9 = \infty$ | $d_9 = 6.00$ | $n_{5,810} = 1.51012$ |
| $r_{10} = \infty$ | $d_{10} = 1.00$ | |
| $r_{11} = \infty$ | $d_{11} = 5.00$ | $n_{6,810} = 1.51012$ |
| $r_{12} = \infty$ | $d_{12} = 1.00$ | |
| $r_{13} = 31.14$ | $d_{13} = 6.00$ | $n_{7,810} = 1.51012$ |
| $r_{14} = \infty$ | $d_{14} = 1.00$ | |
| $r_{15} = 31.14$ | $d_{15} = 6.00$ | $n_{8,810} = 1.51012$ |
| $r_{16} = \infty$ | $d_{16} = 1.00$ | |
| $r_{17} = 41.52$ | $d_{17} = 4.80$ | $n_{9,810} = 1.51012$ |
| $r_{18} = \infty$ | | |

<y-direction>

$f_y = -6.676$
$NA_y = 0.342$
$b_y = -1.90719$
$s_1 = -1.50$
$y_0 = 1.20$
$|\Psi_{2y} f_y| = 0.1821$

| | | |
|---|---|---|
| $r_1 = 5.00$ | $d_1 = 10.00$ | $n_{1,810} = 1.51012$ |
| $r_2 = -5.00$ | $d_2 = 2.00$ | |
| $r_3 = \infty$ | $d_3 = 7.00$ | $n_{2,810} = 1.51012$ |

-continued

| | | |
|---|---|---|
| $r_4 = \infty$ | $d_4 = 8.00$ | |
| $r_5 = -15.57$ | $d_5 = 2.00$ | $n_{3,810} = 1.51012$ |
| $r_6 = 15.57$ | $d_6 = 2.50$ | |
| $r_7 = 15.57$ | $d_7 = 6.00$ | $n_{4,810} = 1.51012$ |
| $r_8 = \infty$ | $d_8 = 26.00$ | |
| $r_9 = 31.14$ | $d_9 = 6.00$ | $n_{5,810} = 1.51012$ |
| $r_{10} = \infty$ | $d_{10} = 1.00$ | |
| $r_{11} = 36.33$ | $d_{11} = 5.00$ | $n_{6,810} = 1.51012$ |
| $r_{12} = \infty$ | $d_{12} = 1.00$ | |
| $r_{13} = \infty$ | $d_{13} = 6.00$ | $n_{7,810} = 1.51012$ |
| $r_{14} = \infty$ | $d_{14} = 1.00$ | |
| $r_{15} = \infty$ | $d_{15} = 6.00$ | $n_{8,810} = 1.51012$ |
| $r_{16} = \infty$ | $d_{16} = 1.00$ | |
| $r_{17} = 41.52$ | $d_{17} = 4.80$ | $n_{9,810} = 1.51012$ |
| $r_{18} = \infty$ | | |

Aberration diagrams showing the spherical aberrations and astigmatisms of the first to fifth embodiments mentioned above are presented in FIGS. 8 to 12. However, the suffixes (a) and (b) stand for aberration diagrams across the sections in the x and y directions, respectively.

With the focusing optical system for semiconductor lasers according to the invention explained above, a light beam with a high NA, coming from a linear light source with the line width being not taken as infinitely small, can be regulated in terms of magnification power in the horizontal and vertical directions, to focus it on a spot having almost nearly equal diameters in both the directions. Then, the magnitude of aberration can be regulated to achieve a focusing efficiency increase and ensure the back focus of sufficient magnitude.

What we claim is:

1. A focusing optical system for focusing a light beam emitted from a light source having varying exit angles in both a horizontal and a vertical direction on a spot form having substantially equal diameters in said horizontal and vertical directions, comprising:
    a first lens unit including at least one rotation asymmetric lens having a positive power to a direction defined at least by a larger exit angle of said varying exit angles;
    a second lens unit including a negative power lens and a positive power lens; and
    a third lens unit including at least one rotation asymmetric lens having positive power with respect to said direction defined by said larger exit angle as a whole and having positive power with respect to a second direction defined by a smaller exit angle of said varying exit angles.

2. A focusing optical system for focusing a light beam emitted from a light source having varying exit angles in both a horizontal and a vertical direction on a spot form having substantially equal diameters in said horizontal and vertical directions, comprising:
    a first lens unit including at least one rotation asymmetric lens having a positive power with respect to a direction defined at least by a larger exit angle of said varying exit angles;
    a second lens unit having at least one negative power lens with a rotation symmetric shape; and
    a third lens unit having at least one rotation asymmetric lens having a positive power with respect to a direction defined by said larger exit angle as a whole and having positive power with respect to a direction defined by a smaller exit angle of said varying exit angles.

3. A focusing optical system as claimed in claim 1 or 2, wherein the positive power of the third lens unit with respect to the direction defined by the larger exit angle is different from that with respect to the direction defined by the smaller exit angle.

4. A focusing optical system as claimed in claim 3, wherein the positive power of the third lens unit with respect to the direction defined by the smaller exit angle is approximately stronger than that with respect to the direction defined by the larger exit angle.

5. A focusing optical system having an incident side as claimed in claim 1, wherein the second lens unit includes, in order from the incident side of said light beam, at least a positive power lens and a negative power lens.

6. A focusing optical system having an incident side as claimed in claim 1, wherein the second lens unit includes, in order from the incident side of said light beam, said negative power lens and said positive power lens.

7. A focusing optical system as claimed in claim 1 or 2, wherein said optical system satisfies the following condition:

$$|\Psi_{2y} f_y| > 0.5$$

where $\Psi_{2y}$ is the composite power of the second lens unit in the direction defined by the larger exit angle, and $f_y$ is the focal length of the overall system in the direction defined by the larger exit angle.

* * * * *